United States Patent
O'Daniel et al.

(10) Patent No.: US 12,210,178 B2
(45) Date of Patent: *Jan. 28, 2025

(54) UNDER DISPLAY ILLUMINATOR WITH INCREASED TRANSMISSION EFFICIENCY AND METHOD OF USE THEREOF

(71) Applicant: II-VI Delaware, Inc., Wilmington, DE (US)

(72) Inventors: Jason O'Daniel, Gunter, TX (US); Pei-Song Cai, Taoyuan (TW); Francesco Schiattone, San Jose, CA (US)

(73) Assignee: II-VI Delaware, Inc., Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/422,089

(22) Filed: Jan. 25, 2024

(65) Prior Publication Data

US 2024/0230975 A1 Jul. 11, 2024

Related U.S. Application Data

(63) Continuation of application No. 18/094,840, filed on Jan. 9, 2023, now Pat. No. 11,914,183.

(51) Int. Cl.
*F21V 8/00* (2006.01)
*G06V 10/145* (2022.01)
*H01L 25/075* (2006.01)

(52) U.S. Cl.
CPC ........... *G02B 6/002* (2013.01); *G02B 6/0068* (2013.01); *G06V 10/145* (2022.01); *H01L 25/0753* (2013.01)

(58) Field of Classification Search
CPC .... G02B 6/002; G02B 6/0068; G06V 10/145; H01L 25/0753; H01L 25/167
See application file for complete search history.

(56) References Cited

U.S. PATENT DOCUMENTS

| | | | |
|---|---|---|---|
| 2019/0098187 A1 | 3/2019 | Wang et al. | |
| 2019/0310724 A1 | 10/2019 | Yeke Yazdandoost et al. | |
| 2019/0377067 A1* | 12/2019 | Han | G01S 7/4815 |

(Continued)

FOREIGN PATENT DOCUMENTS

| | | |
|---|---|---|
| JP | 20035165 A | 1/2003 |
| JP | 2014235896 A | 12/2014 |

(Continued)

OTHER PUBLICATIONS

Sudol, "Lau Effect: An Interference Phenomenon in Partially Coherent Light", The Institute of Optics, 1981, pp. 1-261, The University of Rochester, Rochester, New York.

*Primary Examiner* — Donald L Raleigh
(74) *Attorney, Agent, or Firm* — The Webb Law Firm

(57) ABSTRACT

A display includes a stack that includes, from top to bottom: a display layer including an array of spaced pixels and/or spaced subpixels and an array of spaced transmission spaces, wherein each transmission space is defined by a spacing between a subset of the spaced pixels and/or spaced subpixels; a micro-lens array (MLA) layer including an array of micro-lenses, wherein each micro-lens includes a curved surface; and a laser light emitting (LLE) layer including an array of lasers, wherein the curved surfaces of the micro-lenses face the LLE layer.

15 Claims, 6 Drawing Sheets

(56) References Cited

U.S. PATENT DOCUMENTS

| | | |
|---|---|---|
| 2020/0097699 A1 | 3/2020 | Zeng et al. |
| 2020/0209729 A1* | 7/2020 | Chen .................. G03B 21/62 |
| 2021/0408074 A1* | 12/2021 | Xu .................. H01L 27/1229 |
| 2022/0228857 A1 | 7/2022 | Stasio |

FOREIGN PATENT DOCUMENTS

| | | |
|---|---|---|
| JP | 2021508100 A | 2/2021 |
| JP | 2021517699 A | 7/2021 |

* cited by examiner

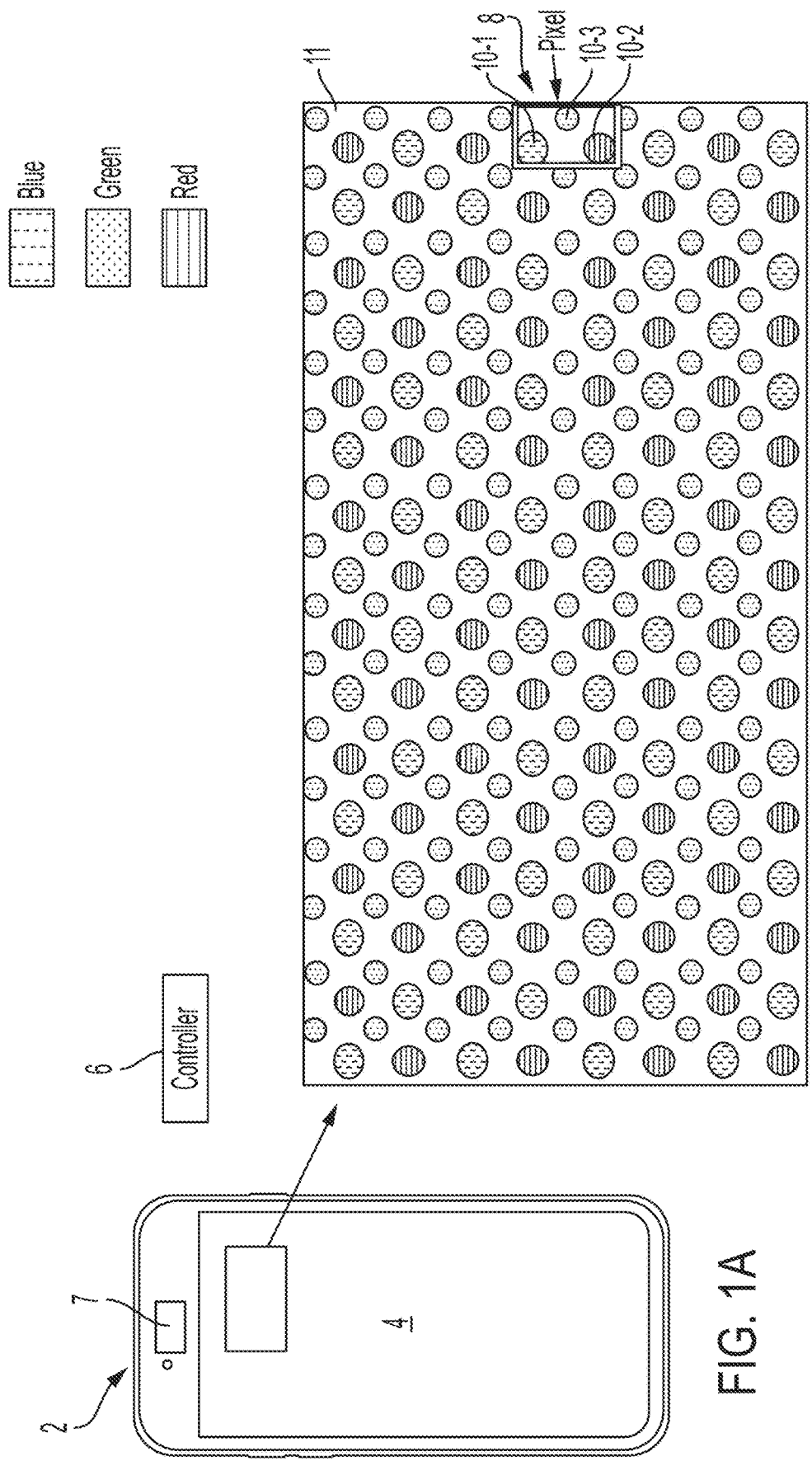

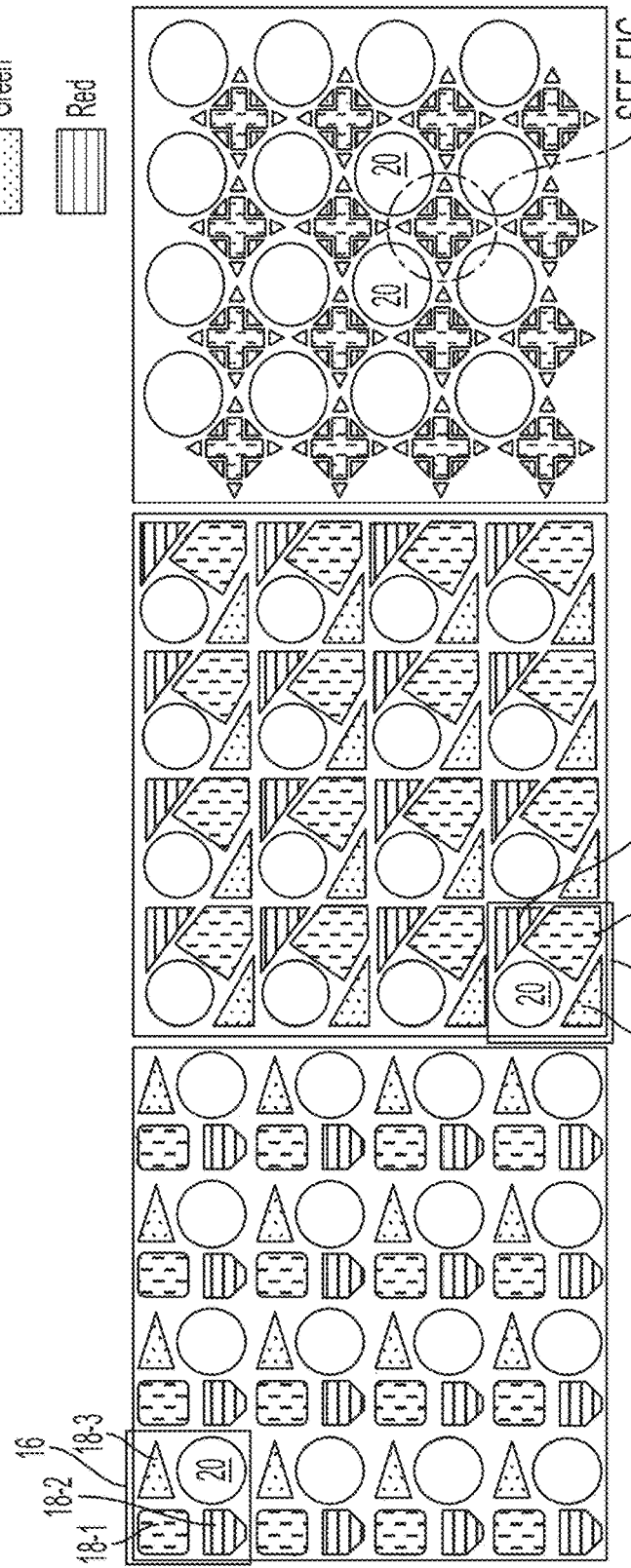
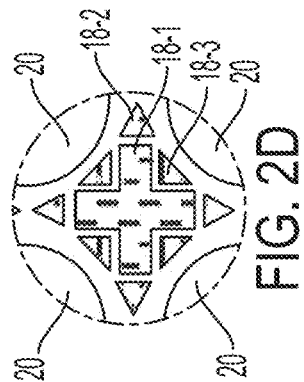
FIG. 2A  FIG. 2B  FIG. 2C  FIG. 2D

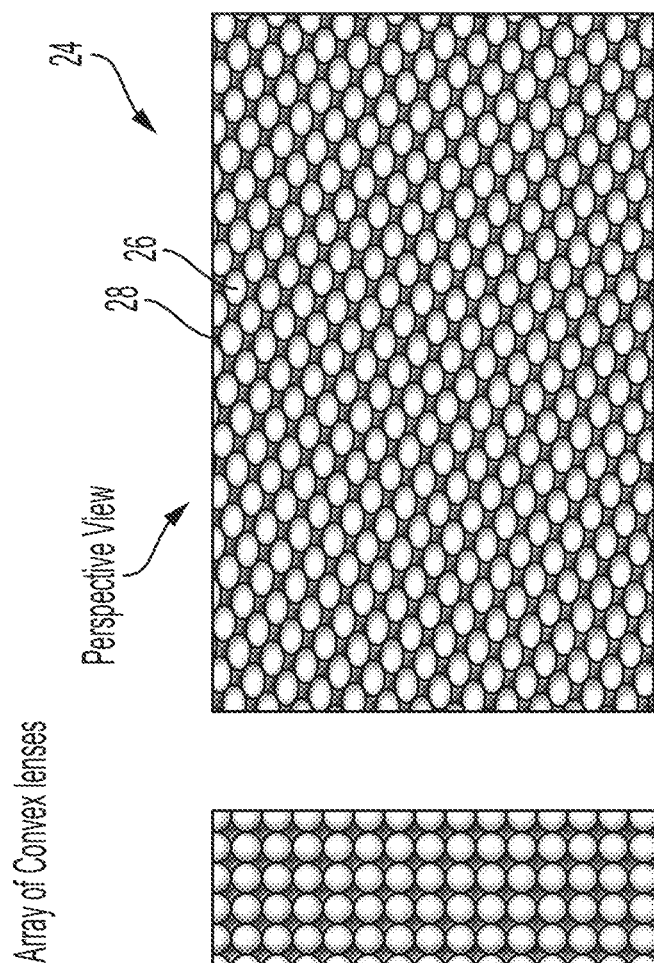
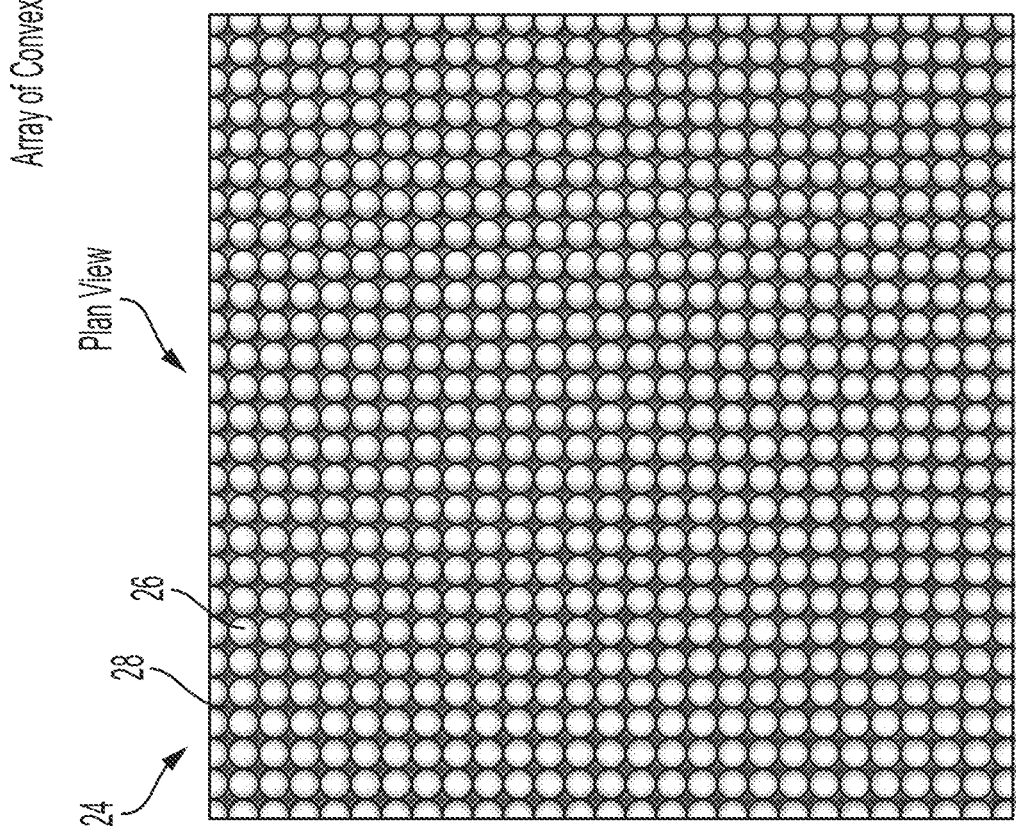
FIG. 5B
Array of Convex lenses
FIG. 5A

UNDER DISPLAY ILLUMINATOR WITH INCREASED TRANSMISSION EFFICIENCY AND METHOD OF USE THEREOF

CROSS REFERENCE TO RELATED APPLICATION

This application is a continuation of U.S. patent application Ser. No. 18/094,840, filed Jan. 9, 2023, the contents of which are incorporated herein in its entirety by reference.

BACKGROUND

1. Field

The present disclosure describes an under display illuminator having improved flood or dot projection of light, e.g., laser light, through a display, e.g., without limitation, the display of a smart phone or tablet computer. The under display illuminator can be used in combination with a sensor, e.g., without limitation, a camera of the smart phone or tablet computer, that can detect a reflection of the projected light on an object and a processor or controller coupled to the sensor that can process the reflected light to determine a feature of the object.

2. Description of Related Art

Many, if not all, presently produced computer controlled smartphones and tablet computers have a processor or controller controlled front-facing display or screen and a front-facing camera or sensor, i.e., a camera or sensor that faces in the same direction as the display which may be, e.g., without limitation, an OLED, LCD, or LED flat panel display. Herein, smartphones, tablet computers, and other devices having a front-facing display and a front-facing camera or sensor may be referred to as a "smart device" and the terms "smart device", "smartphone", and "tablet computer" may be used interchangeably. The processor or controller of such smart device can be programmed or configured to perform feature recognition on an image of an object acquired by the camera or sensor.

There is presently a desire to include an illumination source or an optical source behind the display as an aid to enhancing the illumination of an object with light from the optical source to thereby enhance the quality of an image of the object acquired by the camera and thereby enhance the ability of the controller to perform feature recognition of a feature of the object. Herein, the terms "illumination source", "illumination sources", "optical source", and "optical sources" may be used interchangeably.

A challenge with including one or more optical sources behind the display is that such arrangement limits the amount of transmission of optical energy from the optical sources behind the display to the object being illuminated.

SUMMARY

Disclosed herein is a display that includes a display layer including an array, grid or matrix of spaced pixels and an array, grid, or matrix of spaced transmission spaces. Each pixel includes a plurality of spaced subpixels and each transmission space is defined by a spacing between: a subset of the spaced pixels, a subset of the spaced subpixels, or some combination of the subset of the spaced pixels and the subset of the spaced subpixels. A micro-lens array (MLA) layer includes an array, grid or matrix of micro-lenses. The display layer and the MLA layer are positioned whereupon each micro-lens is positioned in alignment with a corresponding one of the transmission spaces of the display layer and each micro-lens includes a surface that is curved, rounded, or convex facing away from the corresponding transmission space. A laser light emitting (LLE) layer includes an array, grid or matrix of laser diodes. Each laser diode is positioned in alignment with one micro-lens of the MLA layer and the corresponding transmission space of the display layer, wherein the LLE layer is positioned on a side of the MLA layer opposite the display layer with the curved, rounded, or convex surfaces of the micro-lenses facing the LLE layer.

Also disclosed herein is a method of using the display with a computer controlled device. The method includes: (a) causing a subset of the laser diodes of the LLE layer to project laser light through a subset of the micro-lenses of the MLA layer to an object, whereupon each of said subset of the micro-lenses causes rays of the laser light being project therethrough to converge and pass through a corresponding transmission space in alignment with the micro-lens; (b) viewing by a camera of a computer controlled device reflections of the laser light from the object; (c) processing by a controller of the computer controlled device the reflections of the laser light on the object viewed by the camera in step (b) to determine a feature of the object; and (d) causing by the controller of the computer controlled device to perform a predetermined function based on the feature of the object determined in step (c).

BRIEF DESCRIPTION OF THE DRAWING(S)

FIG. 1A is schematic plan view of a computer controlled device in the form of, for example, without limitation, a smart phone or a tablet computer including a prior art flat panel display that may be housed in a housing of the computer controlled device;

FIG. 1B is an enlarged, isolated schematic plan view of a portion of the prior art flat panel display of the computer controlled device of FIG. 1A, including an example arrangement of pixels and subpixels in accordance with the prior art;

Figure 3:
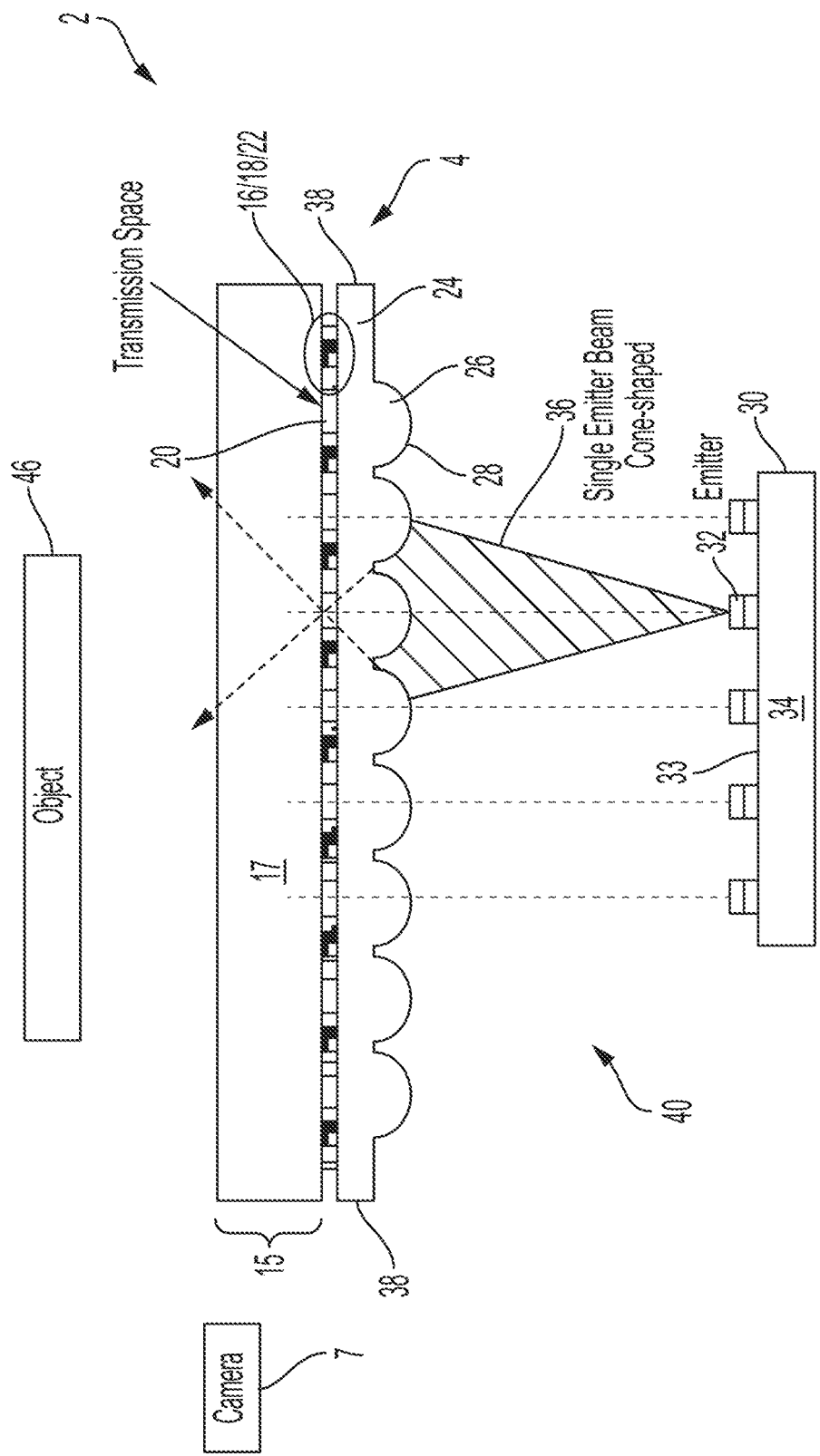
Figure 4:
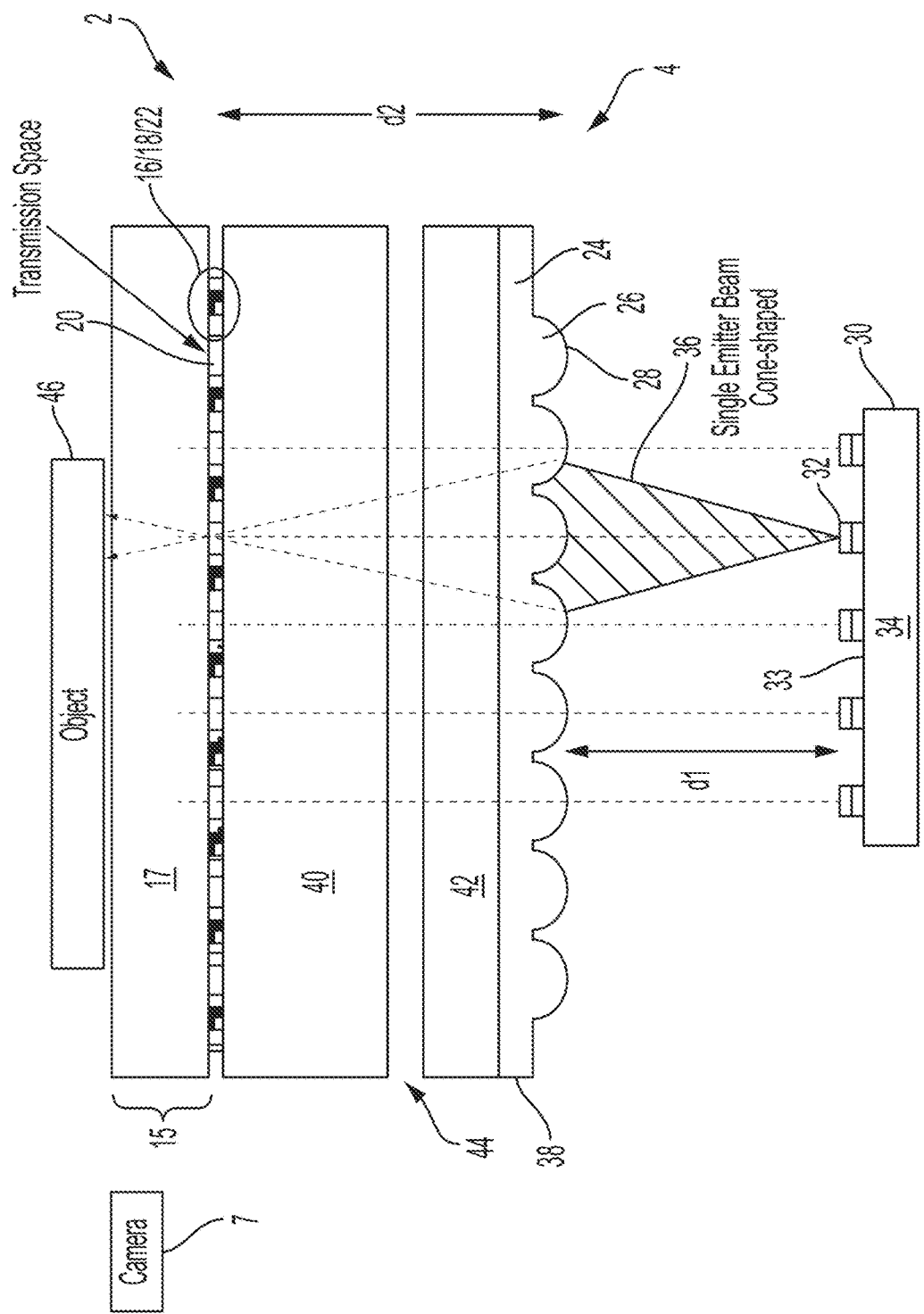

FIGS. 2A-2C are isolated schematic plan views of portions of flat panel displays, each of which may separately be housed in the housing of the computer controlled device of FIG. 1A in replacement of the display having the example arrangement of pixels and subpixels shown in FIG. 1B, and illustrating examples arrangements of pixels, subpixels, and transmission spaces in accordance with the principles of the present disclosure;

FIG. 2D is an enlarged view of a portion of the flat panel display of FIG. 2C;

FIG. 3 is a schematic isolated sectional view of an example combination stack that includes a display layer, a micro-lens array (MLA) layer, and a laser light emitting (LLE) layer that includes, in an example, an array of vertical-cavity surface-emitting lasers (VCSELs), wherein the combination shown in FIG. 3 may be housed in the housing of the computer controlled device of FIG. 1A in replacement of the flat panel display shown in FIG. 1B, wherein the display layer includes an arrangement of pixels, subpixels, and transmission spaces, all of the foregoing in accordance with the principles of the present disclosure;

FIG. 4 is a schematic isolated sectional view of another example combination stack that includes a display layer, a panel substrate, a MLA substrate, a MLA layer, and a LLE layer that includes, in an example, an array of vertical-cavity surface-emitting lasers (VCSELs), wherein the combination shown in FIG. 4 may be housed in the housing of the computer controlled device of FIG. 1A in replacement of the flat panel display shown in FIG. 1B, wherein the display layer includes an arrangement of pixels, subpixels, and transmission spaces, all of the foregoing in accordance with the principles of the present disclosure;

FIG. 5A is plan view of a MLA layer in accordance with the principles of the present disclosure;

FIG. 5B is a perspective view of the MLA layer of FIG. 5A; and

Figure 6:
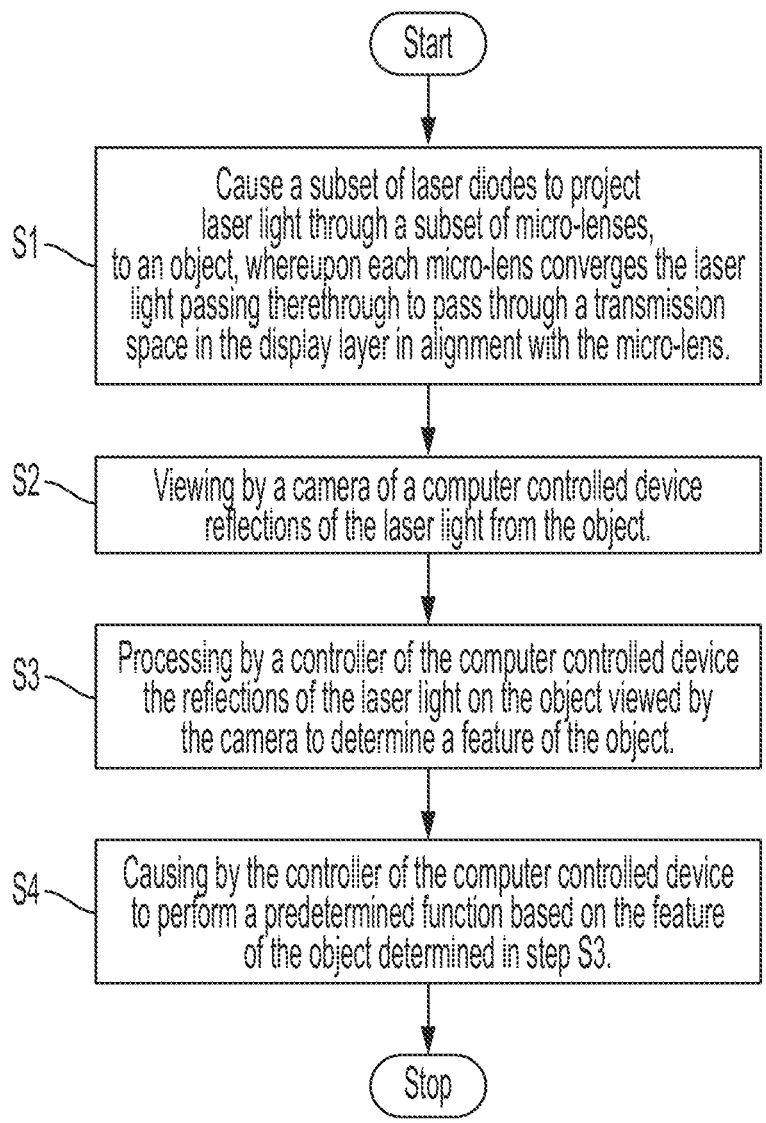

FIG. 6 is a flow diagram of a method in accordance with the principles of the present disclosure.

DESCRIPTION

Various non-limiting examples will now be described with reference to the accompanying figures where like reference numbers correspond to like or functionally equivalent elements.

For purposes of the description hereinafter, terms like "end", "upper", "lower", "right", "left", "vertical", "horizontal", "top", "bottom", "lateral", "longitudinal", and derivatives thereof shall relate to the example(s) as oriented in the drawing figures. However, it is to be understood that the example(s) may assume various alternative variations and step sequences, except where expressly specified to the contrary. It is also to be understood that the specific example(s) illustrated in the attached drawings, and described in the following specification, are simply exemplary examples or aspects of this disclosure. Hence, the specific examples or aspects disclosed herein are not to be construed as limiting.

With reference to FIG. 1A, many computer controlled devices, such as a smart phone or a tablet computer 2, include an integral flat panel, touch screen display, e.g., an OLED flat panel, touch screen display (herein sometimes referred to as an "OLED display" or simply "display") 4, that is operated under the control of a controller 6 of the computer controlled device which may also include a camera 7. While this disclosure may refer specifically to an OLED display, this is not to be construed in a limiting sense since it is envisioned that the present disclosure may be used with any other suitable and/or desirable flat panel, touch screen display now known or hereinafter developed, e.g., a microLED display.

Herein, reference may be made to: a smart phone 2 as one non-limiting embodiment or example of a computer controlled device in accordance with the principles of the present disclosure; OLED display 4 as one non-limiting embodiment or example of an integral flat panel, touch screen display in accordance with the principles of this disclosure; and controller 6 as one non-limiting embodiment or example of a controller that may include one or more processors, persistent/static and/or dynamic computer memory (e.g., without limitation, RAM, ROM, EPROM, EEPROM, etc.) used for storing volatile and non-volatile computer readable program code used to control the operation of the smart phone 2, input/output circuitry including display circuity to drive the pixels of the display 4 and to receive touch input from the display 4, to control the operation of the camera 7 and to receive and store picture data from the camera 7, and the like in accordance with the principles of this disclosure. However, this is not to be construed in a limiting sense since it is envisioned that the principles of the present disclosure may be used in computer controlled devices other than a smart phone 2.

With reference to FIG. 1B and with continuing reference to FIG. 1A, a prior art OLED display 4 includes an array, grid, or matrix of spaced picture elements (pixels) 8, each of which includes one or more subpixels 10, on a display layer 11. In some non-limiting embodiments or examples, each pixel of a prior art OLED display may include three spaced subpixels, namely, a blue subpixel 10-1, a red subpixel 10-2, and a green subpixel 10-3. The elements that form the touch screen features of OLED display 4 are omitted for the purpose of simplicity.

Having described a prior art OLED display 4, OLED displays in accordance with the principles of the present disclosure that may be used in replacement of OLED display 4 in FIG. 1B will now be described with reference to the portions (4×4 array, grid, or matrix of pixels) of OLED displays shown in FIGS. 2A-2D.

FIGS. 2A-2D illustrate three non-limiting embodiment or example display layers 15, each of which may include a different array, grid, or matrix of pixels 16 on a substrate 17 which may be formed of a material that is fully or substantially transparent or transmissive to the passage therethrough of light output by pixels 16 and laser light (discussed hereinafter). Each pixel 16 may include one or more subpixels 18, such as, for example, without limitation, a blue subpixel 18-1, a red subpixel 18-2, and a green subpixel 18-3. Each display layer 15 may also include an array, grid, or matrix of transmission spaces 20 and transistors 22, e.g., thin-film transistors (shown in FIGS. 3 and 4), for driving and controlling the on-off states and intensities or brightness's of the pixels 16 and/or subpixels 18 under the control of controller 6 via conductive traces (not shown for simplicity) formed on substrate 17 between controller 6 and transistors 22. The elements that form the touch screen features of the display layers 15 shown in FIGS. 2A-2D are omitted for the purpose of simplicity.

As illustrated in FIGS. 2A-2D, each transmission space 20 may be defined by a spacing between: a subset of the spaced pixels 16, a subset of the spaced subpixels 18, or some combination of the subset of the spaced pixels 16 and the subset of the spaced subpixels 18. The three different arrangements of pixels 16, subpixels 18 and transmission spaces 20 shown in FIGS. 2A-2D is strictly for the purpose of illustration and is not to be construed in a limiting sense since it is envisioned that any suitable and/or desirable arrangements of pixels 16, subpixels 18 and transmission spaces 20 in accordance with the principles of the present disclosure may be used.

In an example, each transmission space 20 may be fully or partially (>80%) transparent or transmissive to the passage of at least laser light therethrough. In an example, each transmission space 20 may be an opening in display layer 15 or a portion of or insert to display layer 15 that is fully or partially transparent or transmissive to the passage of at least laser light therethrough.

With reference to FIG. 3, in some non-limiting embodiments or examples, a display in accordance with the principles of the present disclosure may include a micro-lens array (MLA) layer 24 positioned below display layer 15, with pixels 16 (including subpixels 18) and transistors 22 formed on display layer 15 positioned between MLA layer 24 and substrate 17 of display layer 15. In an example, pixels 16 (including subpixels 18) and transistors 22 of display layer 15 may be in contact with or may be slightly spaced from MLA layer 24.

In an example, substrate 17 of display layer 15 may be used as a cover layer of the OLED display 4 when used as the display of a smart phone 2. However, this is not to be construed in a limiting sense since is it envisioned that the surface of substrate 17 opposite pixels/subpixels 16/18 may, in the use of OLED display 4 as the display of a smart phone 2, for example, be covered by one or more other fully or partially transparent or transmissive layers.

MLA layer 24 may include an array, grid or matrix of micro-lenses 26 positioned in alignment with the array, grid, or matrix of transmission spaces 20 of display layer 15. Stated differently, the display layer 15 and the MLA layer 24 may be positioned whereupon each micro-lens 26 is positioned in alignment with a corresponding one of the transmission spaces 20 of the display layer 15. In an example, each micro-lens 26 includes a surface 28 that is curved, rounded, or convex facing away from the corresponding transmission space 20.

Herein, the term(s) "aligned", "alignment", "in alignment", and the like is/are to be broadly construed as the proper positioning or state of adjustment of two or more elements with respect to each other, e.g., a micro-lens 26 of the MLA layer 24 in alignment with a corresponding transmission space 20 of the display layer 15, for the purpose described herein but not necessarily that the two or more elements are on-axis or coaxial to each other. In other words, as used herein, the term(s) "aligned", "alignment", "in alignment", and the like may or may not include two or more elements on-axis or coaxial with each other, e.g., a micro-lens 26 on-axis or coaxial with a corresponding transmission space 20.

Positioned below MLA layer 24 is a laser light emitting (LLE) layer 30 comprising an array, grid or matrix of lasers or laser diodes 32 positioned on a surface 33 of a substrate 34 that faces MLA layer 24. In an example, laser diodes 32 may be vertical-cavity surface-emitting lasers (VCSELs), each of which is a type of semiconductor laser diode with laser light or beam 36 emission or projection away from surface 33 toward the MLA layer 24. In an example, each laser diode 32 is positioned on LLE layer 30 in alignment with one micro-lens 26 of the MLA layer 24 and the corresponding transmission space 20 of the display layer 15.

The laser light 36 projected by each laser 32 projects in a filled cone shape, i.e., the laser light fills the volume of the cone (shown by the cross-hatching of the cone-shaped laser light 36 in FIG. 3), not just along the "surface" of the cone. The laser light 36 projected by each laser 32 diverges in a cone-shape and passes through the micro-lens 26 in alignment with the laser and one or more micro-lenses 26 proximate to, immediately adjacent and surrounding the micro-lens 26 in alignment with the laser 32. The curved, rounded, or convex surface 28 of the micro-lens 26 in alignment with the laser 32 causes the laser light 36 to converge and pass through the corresponding transmission space 20. Moreover, the curved, rounded, or convex surface 28 of each micro-lens 26 proximate to, immediately adjacent and surrounding the micro-lens 26 in alignment with the laser 32 causes the laser light 36 to converge and pass through its corresponding transmission space 20.

In the 2-dimensional example shown in FIG. 3, the cone-shaped laser light 36 projected by one laser 32 passes through the micro-lens 26 in alignment with said laser 32 and the micro-lenses 26 on either side of said micro-lens 26 in alignment with the laser 32. Moreover, the cone-shaped laser light 36 will also pass through micro-lenses 26 (not shown) that may be proximate to and immediately adjacent said micro-lenses 26 in alignment with the laser 32 in direction (s) perpendicular to the plane of FIG. 3, i.e., in directions into and out from the 2-dimensioinal plane shown in FIG. 3. In other words, the laser light 36 projected by each laser 32 may pass through the micro-lens 26 in alignment with said laser 32 and the micro-lenses 26 that surround said micro-lens 26.

In FIG. 3 only one cone-shaped laser light laser light 36 projected by one laser 32 is illustrated for simplicity. However, it is to be appreciated that each laser 32 may at the same time or simultaneously, project cone-shaped laser light 36 (as shown in FIG. 3) that may pass through the micro-lens 26 in alignment with said laser 32 and the micro-lenses 26 that surround said micro-lens 26. Moreover, as can be understood from FIG. 3, a subset of the micro-lenses 26 of MLA layer 24 that are proximate to and immediately adjacent each other may each receive cone-shaped laser light laser light 36 projected by two or more lasers 32 that are proximate to and immediately adjacent each other.

In the example shown in FIG. 3, micro-lenses 26 proximate to and immediately adjacent the perimeter 38 of MLA layer 24 may not have lasers 32 in alignment with said micro-lenses 26. Accordingly, in this example, the micro-lenses 26 proximate to and immediately adjacent the perimeter 38 of MLA layer 24 may receive cone-shaped laser light 36 only from lasers 32 not in alignment with said micro-lenses 26. In an example, the MLA layer 24 may include an X-Y array, grid or matrix of micro-lenses 26 (where X and Y may be the same or a different number) and the LLE layer 30 may include an (X−1)-(Y−1) array, grid or matrix of lasers 32. However, this is not to be construed in a limiting sense since it is envisioned, as may be deemed suitable and/or desirable by one skilled in the art for a particular application, that the MLA layer 24 may include any number of micro-lenses 26 arranged in an array, grid or matrix (including a one-dimensional array) and/or that the LLE layer 30 may include any number of lasers 36 arranged in an array, grid or matrix (including a one-dimensional array).

In the examples shown in FIG. 3 and FIG. 4 (discussed next) display layer 15, MLA layer 24, and LLE layer 30 may be held in relative position to each other inside of a body (see FIG. 1) of smart phone 2. The body of smart phone 2 may be formed of material(s) that prevent(s) or avoid(s) the passage of laser light 36 in directions other than through substrate 17.

With reference to FIG. 4 and with continuing reference to FIG. 3, in some non-limiting embodiments or examples, a display in accordance with the principles of the present disclosure may be similar to the display shown in FIG. 3 with the following exceptions. Instead of pixels 16 (including subpixels 18) and transistors 22 of display layer 15 being in contact with or slightly spaced from MLA layer 24 (FIG. 3), pixels 16 (including subpixels 18) and transistors 22 of display layer 15 may be separated from MLA layer 24 by a panel substrate 40 and a MLA substrate 42 which may be in contact with each other or spaced from each other by an optional gap 44.

In an example, pixels 16 (including subpixels 18) and transistors 22 of display layer 15 may be in contact with or may be slightly spaced a top surface of panel substrate 40 and a bottom surface of MLA substrate 42 may be in contact with or may be slightly spaced a top surface of MLA layer 24.

In the examples shown in FIGS. 3 and 4, laser light 36 projected by each laser 32 passes through the micro-lens 26 in alignment with the laser whereupon the diffractive properties of the laser light 36 combined with a pitch of the array, grid or matrix of micro-lenses 26 of the MLA layer 24 and the distance between the lasers 32 and the array, grid or matrix micro-lens 26 of the MLA layer 24 causes the laser light 36 emitted by the lasers 32 to create a reimaging of the convergence of the light that passes through the corresponding transmission space 20. In FIG. 4, the distance d2 between the micro-lenses 26 of the MLA layer 24 and transmission spaces 20 may be a fraction or full Talbot length distance, which may be equal (or substantially equal) to distance d1. However, this is not to be construed in a limiting sense since it is envisioned that distances d1 and d2 may be different.

In an example, in FIG. 4, laser light 36 passing through a subset of the micro-lenses 26 that are proximate or adjacent each other and/or not proximate or adjacent each other, may converge on a transmission space 20. For example, laser light 36 passing through three, four, five, or more of the proximate or adjacent micro-lenses 26 shown in the plane of FIG. 4 may converge on one or more transmission spaces 20. Stated differently, each transmission space 20 may receive laser light 36 that passes through three, four, five, or more micro-lenses 26, which may or may not be proximate or adjacent each other.

FIG. 5A shows a plan view of one non-limiting embodiment or example MLA layer 24 in accordance with the principles of the present disclosure. FIG. 5B shows a perspective view of the MLA layer 24 shown in FIG. 5A.

Having thus described displays in accordance with the principles of the present disclosure, a method of using the displays in a smart phone 2 will now be described with reference to the flow diagram of FIG. 6 and with continuing reference to FIGS. 1A, 3 and 4.

The method of FIG. 6 begins by advancing from a Start step to step S1, wherein the controller 6, operating under the control of computer readable program code stored in a non-volatile memory of the smart phone 2, causes a subset of the laser diodes 32 to project laser light 36 through a subset of the micro-lenses 26 to an object 46 (FIGS. 3 and 4), whereupon each micro-lens 26 converges the laser light 36 passing therethrough to pass through at least one transmission space 20 in the display layer 15 in alignment with the micro-lens 26. Herein, a subset is a set that includes elements of a given set that can be the same as the given set or smaller.

In step S2, the camera 7 of smart phone 2, under the control of the controller 6, views and acquires an image of the reflections of the laser light 36 from the object 46.

In step S3, the controller 6 processes the acquired reflections of the laser light 36 from the object 46 to determine a feature of the object 46

In step S4, the controller 6 then performs a predetermined function based on the feature of the object determined in step S3.

The method then advances to a Stop step.

In an example, object 46 may be the face of a user of the smart phone 2 that includes a display in accordance with the principles of the present disclosure and the predetermined function may be to unlock the smart phone 2 for use by the user upon the controller 6 determining a suitable match between the feature of the object determined from the acquired image of the reflections of the laser light 36 from the object 46 and a sample image previously stored in the non-volatile memory of the smart phone 2 for this purpose.

Although the disclosure has been described in detail for the purpose of illustration based on what is currently considered to be the most practical and preferred embodiments, it is to be understood that such detail is solely for that purpose and that the disclosure is not limited to the disclosed embodiments, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

The invention claimed is:

1. A display comprising:
a display layer including an array, grid or matrix of spaced pixels and an array, grid, or matrix of spaced transmission spaces, wherein each pixel includes a plurality of spaced subpixels and each transmission space is defined by a spacing between: a subset of the spaced pixels, a subset of the spaced subpixels, or some combination of the subset of the spaced pixels and the subset of the spaced subpixels;
a micro-lens array (MLA) layer including an array, grid or matrix of micro-lenses, wherein each micro-lens includes a surface that is curved, rounded, or convex facing away from the display layer; and
a laser light emitting (LLE) layer comprising an array, grid or matrix of lasers, wherein the LLE layer is positioned on a side of the MLA layer opposite the display layer with the curved, rounded, or convex surfaces of the micro-lenses facing the LLE layer, wherein each laser is positioned coaxial with one micro-lens of the MLA layer.

2. The display of claim 1, wherein each transmission space is defined by the spacing between at least two, or three, or four of the pixels or subpixels.

3. The display of claim 1, wherein each micro-lens is positioned in alignment with one of the transmission spaces of the display layer.

4. The display of claim 1, wherein the spaced pixels, the spaced subpixels, or both are arranged in rows and columns.

5. The display of claim 1, wherein each pixel includes at least one of the following: a blue subpixel, a red subpixel, and/or a green subpixel.

6. The display of claim 1, wherein each laser is a vertical-cavity surface-emitting laser.

7. The display of claim 1, wherein laser light projected by each laser passes through at least one micro-lens whereupon the curved, rounded, or convex surface of said micro-lens causes the laser light to converge and pass through at least one of the transmission spaces.

8. The display of claim 1, wherein laser light projected by each laser passes through a plurality of micro-lenses, whereupon the diffractive properties of the laser light combined with a pitch of the micro-lens array and the spacing between the laser and the micro-lens array causes the laser light to create a reimaging of the convergence of the light that passes through at least one of the transmission spaces.

9. The display of claim 1, wherein:
the laser light projected by each laser projects in a cone shape; and
the cone shape laser light projected by each laser passes through a plurality of micro-lenses which cause the laser light to converge and pass through a plurality of transmission spaces.

10. The display of claim 1, wherein:
each subpixel is comprised of a light emitting diode (LED); and
the display layer includes thin-film-transistors (TFTs) connected to the subpixels for selectively controlling the on-off state of each LED in response to control signals output by a controller to the TFTs.

11. The display of claim 10, further including a cover layer, wherein:

the subpixels are disposed on a surface of the display layer that faces away from the MLA layer; and the subpixels are positioned between the cover layer and the surface of the display layer that faces away from the MLA layer.

12. The display of claim 11, wherein the cover layer, the display layer, and the micro-lenses of the MLA layer are each at least partially transmissive of a wavelength of laser light output by each laser.

13. The display of claim 12, wherein the display layer includes a substrate layer positioned between the MLA layer and the array, grid or matrix of spaced pixels and the array, grid or matrix of spaced transmission spaces.

14. A method of using the display of claim 1 with a computer controlled device, comprising:
 (a) causing the lasers of the LLE layer to project laser light through the micro-lenses of the MLA layer to an object, whereupon each micro-lens causes rays of the laser light being project therethrough to converge and pass through at least one transmission space;
 (b) viewing by a camera of a computer controlled device reflections of the laser light from the object;
 (c) processing by a controller of the computer controlled device the reflections of the laser light on the object viewed by the camera in step (b) to determine a feature of the object; and
 (d) causing by the controller of the computer controlled device to perform a predetermined function based on the feature of the object determined in step (c).

15. A display comprising a stack that includes, from top to bottom:
 a display layer including an array of spaced pixels and/or spaced subpixels and an array of spaced transmission spaces, wherein each transmission space is defined by a spacing between a subset of the spaced pixels and/or spaced subpixels;
 a micro-lens array (MLA) layer including an array of micro-lenses, wherein each micro-lens includes a curved surface; and
 a laser light emitting (LLE) layer including an array of lasers, wherein the curved surfaces of the micro-lenses face the LLE layer, wherein each laser is positioned coaxial with one micro-lens of the MLA layer.

* * * * *

UNITED STATES PATENT AND TRADEMARK OFFICE
CERTIFICATE OF CORRECTION

| | | |
|---|---|---|
| PATENT NO. | : 12,210,178 B2 | Page 1 of 1 |
| APPLICATION NO. | : 18/422089 | |
| DATED | : January 28, 2025 | |
| INVENTOR(S) | : Jason Kirk O'Daniel et al. | |

It is certified that error appears in the above-identified patent and that said Letters Patent is hereby corrected as shown below:

On the Title Page

Column 1, item (72) Inventors, Line 2, delete "Taoyuan" and insert -- Taoyuan city --

Signed and Sealed this
First Day of April, 2025

Coke Morgan Stewart
*Acting Director of the United States Patent and Trademark Office*